United States Patent [19]

Lanternier

[11] Patent Number: 4,905,788

[45] Date of Patent: Mar. 6, 1990

[54] ELECTRO-ACOUSTIC TRANSDUCERS

[76] Inventor: Philippe Lanternier, 4 Boulevard de Brosses, 21000 Dijon, France

[21] Appl. No.: 104,752

[22] Filed: Oct. 5, 1987

[30] Foreign Application Priority Data

Oct. 7, 1986 [FR] France ............................ 86 13948

[51] Int. Cl.[4] .................................. H05K 5/00

[52] U.S. Cl. .......................... 181/144; 181/146; 181/153; 181/163; 181/171; 181/199

[58] Field of Search ............... 181/144, 146, 148, 150, 181/151, 153, 155, 163, 199, 171, 172

[56] References Cited

U.S. PATENT DOCUMENTS

| | | | |
|---|---|---|---|
| 3,470,976 | 10/1969 | Brevard | 181/171 |
| 3,750,878 | 8/1973 | Pyle, Jr. | 181/153 |
| 3,978,941 | 9/1976 | Siebert | 181/151 |
| 4,146,111 | 3/1979 | Mae et al. | 181/163 X |
| 4,146,744 | 3/1979 | Veranth | 181/146 X |
| 4,169,516 | 10/1979 | Honda | 181/153 |
| 4,284,844 | 8/1981 | Belles | 181/151 X |
| 4,417,714 | 11/1983 | Charm | 248/323 |
| 4,420,061 | 12/1983 | Levy | 181/163 X |
| 4,580,654 | 4/1986 | Hale | 181/153 X |
| 4,673,057 | 6/1987 | Glassco | 181/199 X |

FOREIGN PATENT DOCUMENTS 2101448 1/1981 United Kingdom .

*Primary Examiner*—B. R. Fuller
*Attorney, Agent, or Firm*—McAulay, Fisher, Nissen & Goldberg

[57] ABSTRACT

An electro-acoustic transducer is formed of a loudspeaker enclosure having a form of revolution about an axis each end of which is closed by a loudspeaker. The two loudspeakers are mounted back to back in the axis of the enclosure, one of the loudspeakers being fed from an electric power source and being in this sense "active", whereas the other loudspeaker is "passive" in that it receives no electric supply, its movements resulting from the rear wave of the active loudspeaker. The enclosure is maintained vertically along its axis of revolution, and, on the other hand, the side wall of the enclosure is formed of a flexible material, unlikely to resonate with the front and rear waves of the loudspeakers.

16 Claims, 1 Drawing Sheet

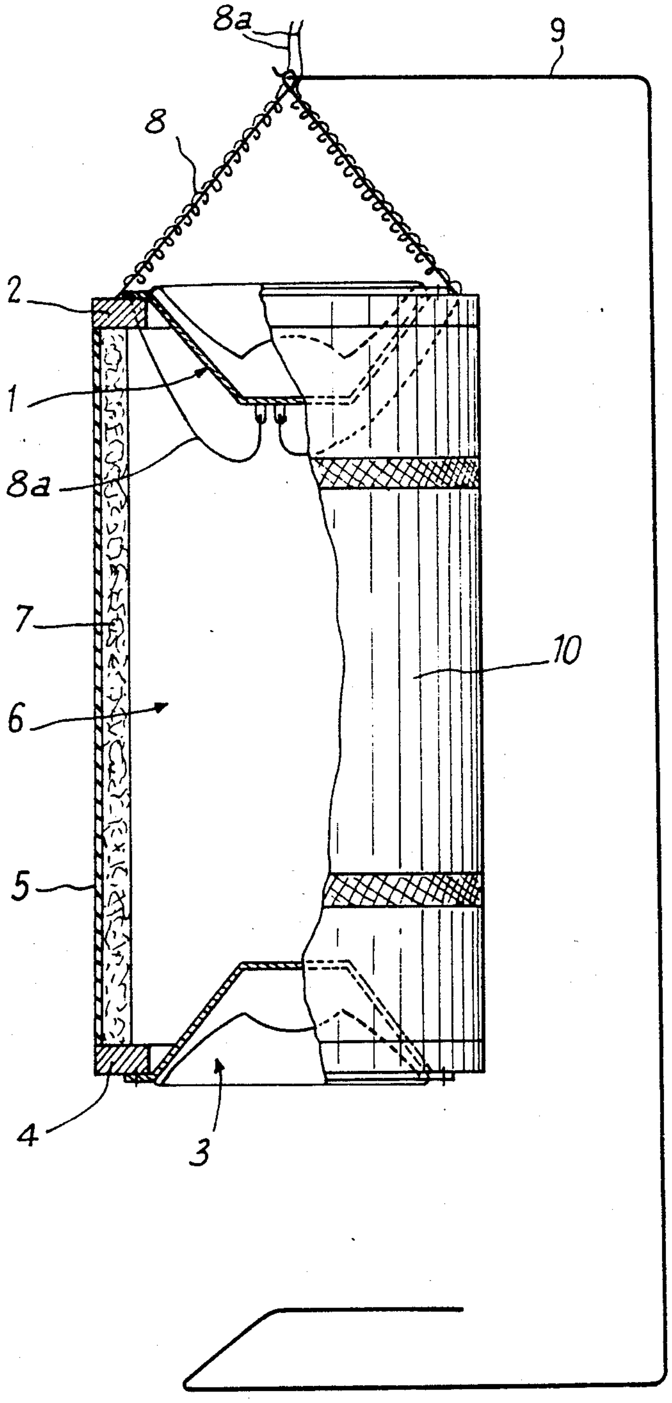
8a
9
8
2
1
8a
7
10
6
5
4
3

ELECTRO-ACOUSTIC TRANSDUCERS

BACKGROUND OF THE INVENTION

1. Field of the Invention

The present invention relates to an electro-acoustic transducer which performs particularly well and is economical, including a flexible loudspeaker enclosure having a form of revolution about its axis and two loundspeakers mounted back to back in the axis of the enclosure.

The great majority of loudspeaker enclosures known up to present include two, three and sometimes four loudspeakers, skillfully connected together so as to try and cover the whole of the audible frequency spectrum. This design generally requires the insertion of a frequency dividing filter between the input of the signal and the different loudspeakers. It is known in this case that the filter alters the sound message by introducing numerous modifications therein:

very substantial reduction of the dynamic range,
reduction of the overall efficiency of the enclosure,
modification of the phase at the cut off frequencies which results in an increase or a decrease of the acoustic power at these frequences.

Problems are also known related to total quality disparities which are inevitable between the different loudspeakers and which adversely affect the faithfulness of the sounds reproduced.

Other sources of annoyance are related to conventional loudspeaker enclosures in which all the active loudspeakers are mounted on the front panel thus, imposing on the assembly a sound directivity forcing the listener to "locate" the optimum or privileged listening area, which is incompatible with the comfort of natural listening, all the more sensitive in the low frequency range.

Furthermore, the generally parallelepipedic shape of multichannel enclosures imposes on the rear wave of the low frequency loudspeaker, operating as a piston, a constraint which results in a prejudicial deformation of the front wave, alone transmitting the sound message. Naturally, this constraint imposed on the rear wave is more or less important depending on the acoustic absorption power of the walls or the degree of sophistication of the vents or baffles intended to attenuate the return of the wave.

Another result of the prismatic shape of the enclosures relates to the edges thereof whereon the vibrations of the loudspeakers are distorted, ruining most of the time the omnidirectional character of the same loudspeakers.

It may finally be noted the conventional observations or difficulties related to traditional cabinet making for this kind of enclosure: being generally poorly suspended, the enclosure frequently resonating and transmitting unpleasant vibrations in the environment, further added to the often unaesthetic appearance of their wooden case, to their weight and the truly unacceptable cost.

2. Description of the Prior Art

In this field of sound emitters or transducers, research work has at all times passionately interested amateurs and professionals; it is therefore not surprising that numerous solutions have been proposed to try and reduce the above mentioned drawbacks.

To reduce the space required by the loudspeaker enclosure, while keeping all the required "high fidelity" qualities, it has been proposed, as indicated in the patent FR 1 330 932, to replace the single membrane of a loudspeaker by two or more membranes moving in phase in the same direction and juxtaposed; thus the rear wave is decoupled from the front wave. In patent FR 1 510 260, interesting attempts can be found for limiting the "confident of the sound" and especially for solving the unacceptable directional character of a conventional installation seriously affecting the pattern of the acoustic radiations.

Other proposals have been set forth particularly in patent FR 2 338 616 for overcoming the distortions and resonances creating disturbances in listening; it has been more particularly proposed to replace the front loudspeakers by at least two similar loudspeakers, disposed in line behind each other, in a common support, which may be cylindrical or not, whose front end is closed by one of the loudspeakers and whose rear end is closed by the other loudspeaker mounted in acoustic phase, that is to say electrically in series or in parallel depending on the arrangement of the membrane of the rear loudspeaker.

It is now known that this type of solution remains very partial; in fact, all the drawbacks of directionality or resonance frequencies remain and are even amplified by the electric coupling of the front and rear loudspeakers, whereas the improvements obtained further increase the price of the installation.

SUMMARY OF THE INVENTION

The present invention aims at overcoming these drawbacks by a solution exceptional in so far as the fidelity of reproduction and sound listening comfort is concerned, and of remarkable simplicity leading not only to an astonishing quality-price ratio, but also having an excellent capacity for being integrated in the environment. We find then, in accordance with the invention, and electro-acoustic transducer formed of an enclosure having a form of revolution about an axis each end of which is closed by a loudspeaker, the two loudspeakers being mounted back to back in the axis of the enclosure. One of the loudspeakers being fed from an electric power source and being in this sense "active", whereas the other loudspeaker is "passive" in that it receives no electric power supply, its movements resulting from the rear wave of the active loudspeaker, wherein the enclosure is maintained vertically along its axis of revolution, and the side wall of the enclosure is formed of a flexible material, known per se, unlikely to resonate with the front and and rear waves of the loudspeakers.

It has been known up to now that placing two loudspeakers in line reinforced the phonic power of the assembly; on the other hand, it has been shown that the use of a single active loudspeaker allows a maximum efficiency to be obtained related exclusive to its own dynamics, the passive loudspeaker "recuperating" the rear wave in a movement resulting directly from the transmitted wave and not from an electric reference giving by definition a rigidity of excitation which has no chance of taking into account the intrinsic reaction of the enclosure. Furthermore, th single active loudspeaker contributes to guaranteeing total homogeneity of the tone quality.

It has also been discovered, in the transducer of the invention, that the form of revolution about an axis, given to the support of the two loudspeakers, ensured for the rear wave of the active loudspeaker a real guidance, naturally amplified by the passive loudspeaker, thus avoiding any constraint and therefore any distortion particularly in the low frequency range, which results in an impression of spontaneity and naturalness.

The support for the two loudspeakers, in accordance with another characteristic of the invention is advantageously formed of a flexible material avoiding any resonance for the rear wave and any diffraction for the front wave. Naturally, it is important for the support to be made from such or such a flexible material which will depend more on economic or aesthetic criteria; in fact, supports may be considered made from corrugated cardboard, from fibers or a compact material or else from leather and even a woven materal.

According to a complementary characteristic of the invention, the transducer has advantageously a cylindrical form providing constructional convenience contributing to the economy of the system; this particular form is, furthermore, quite adapted to another feature of the invention recommending the use of two strictly identical loudspeakers so as to introduce no source of distortions of purely mechanical origin. Finally, the cylindrical shape of the enclosure is ideal for avoiding the well known edge effect in conventional enclosures and consequently completely avoiding diffraction of the sounds.

It is obvious that transducer combinations in accordance with the invention may be envisaged: a passive loudspeaker could for example be used of a diameter different from that of the active loudspeaker, or else the enclosure could have a truncated cone shape, or be bell mouthed on one side, in the form of a hyperboloid of revolution etc...All the tests converge nevertheless towards an optimum solution having a cylindrical support and similar loudspeakers.

In accordance with another complementary feature of the invention, the proposed transducer should be suspended vertically, the active loudspeaker being directed towards the top and the passive loudspeaker towards the ground at a suffisant distance therefrom.

Naturally, a suspension will be preferred perfectly incapable of transmitting vibrations to the environment, used advantageously for the incoming electric wires. Thus a "total" electro-acoustic transducer is obtained ideally loaded and perfectly coupled with the listening space which, for this reason, has much less influence than with conventional enclosures.

Finally, it has been determined, insofar as the dimensions of the electro-acoustic transducer of the invention are concerned, that there exists a relationship tending to choose, as height of the enclosure, twice the mean diameter of the same enclosure and this for a given internal volume.

BRIEF DESCRIPTION OF THE DRAWINGS

One embodiment of the present invention will be described hereafter by way of non limitative example, with reference to the accompanying drawings showing an elevational view, partially in section through its vertical axis, of an electro-acoustic transducer of the invention.

DESCRIPTION OF THE PREFERRED EMBODIMENT

As can be seen in the drawings, the electroacoustic transducer of the invention is formed of a first "active" loudspeaker 1, having an external diameter equal to 21 cm and comprising, in a way known per se, all the electromechanical arrangements providing a pass band between 14 and 18000 Hz. This loudspeaker 1 is mounted on a disk 2 of a diameter equal to 2 5cm. This disk is formed preferably in a panel of a thickness of 19 mm formed of wood chps bonded together by epoxy resin.

A second "passive" loudspeaker similar to the first loudspeaker 1 is also mounted on a disk 4 identical to disk 2.

The two disks 2 and 4 which are centered on the same axis at a distance of 50 cm from each other, receive on their periphery a foil 5, made from corrugated cardboard for example, which is wrapped round the two disks 2 and 4 to which it is fixed by bonding. The grooves of foil 5 are disposed along a generatrix of the cylinder 6 thus formed.

Inside the cylinder 6, the flexible wall formed by foil 5 is covered with a thickness of about 5 cm of rock wool or synthetic cotton wool 7.

Cylinder 6 is suspended vertically by means of two cords 8 fixed to disk 2, hooked onto a bracket support 9, so that the "active" loudspeaker 1 is turned towards the ceiling. This same loudspeaker 1 is fed with power by advantageously using, for example, cords 8 for leading the electric wires 8a from any sound source.

Loudspeaker 3 is not connected to any source and it is left to "work" freely under the action alone of the rear wave of the "active" loudspeaker 1 contributing for this reason to choking it and so to the phonic reinforcement of the front wave with which there is total superimposition at least for the low frequency range.

The electro-acoustic transducer of the invention thus described is advantageously decorated on its side wall 10 so as to be better integrated in the environment. This same environment further determines the optimum height of the "passive" loudspeaker 3, with respect to the ground, considering a minimum height fixed at 30 cm, so that there is perfect acoustic coupling between the transducer and the environment.

The result is then remarkable listening close to its "total" giving the very unexpected impression of listening "inside the instruments", whatever the relative situation of the listener with respect to the transducers.

What is claimed is:

1. In an electro-acoustic transducer formed of a loudspeaker enclosure including a side wall having a form of revolution about a longitudinal axis, each end of which is closed by a loudspeaker, the two loudspeakers being mounted back to back one above the other in vertical alignment with each other and aligned with the longitudinal axis of the enclosure, solely one of the loudspeakers being fed from an electric power source and being an "active" loudspeaker, whereas the other loudspeaker is "passive" in that said "passive" loudspeaker receives no electric supply, and movements of said passive loudspeaker solely result from a rear wave of the active loudspeaker imparted thereto by said active loudspeaker, the enclosure being maintained vertically along an axis of revolution with both speakers mounted coextensively with the opposite ends of said side wall, said side wall not extending beyond said "active" loudspeaker, the side wall of the enclosure being formed of a non-resonsating flexible material, unlikely to resonate with the front and rear waves of the loudspeakers; and a rigid disk fixed to each outermost end of said enclosure, each said disk being formed of a very absorbant acoustic material and having a diameter slightly greater than a diameter of said speakers.

2. The electro-acoustic transducer as claimed in claim 1, wherein each of the two loudspeakers is fixed on one of said single rigid disks and each said rigid disk being made from a simple or composite acoustic and very absorbant material, each of said rigid disks acting as a spacer between said loudspeakers and outermost ends of said enclosure.

3. The electro-acoustic transducer as claimed in claim 1, wherein said enclosure of revolution has a truncated cone shape.

4. The electro-acoustic transducer as claimed in claim 1, wherein the two loudspeakers are of different dimensions.

5. The electro-acoustic transducer as claimed in claim 1, wherein said enclosure has a base with the "passive" loudspeaker mounted therein to face towards ground, and means for supporting said "passive" loudspeaker at a minimum height of 30 cm above the ground.

6. The electro-acoustic transducer as claimed in claim 1, wherein the two loudspeakers are fixed on rigid discs, the discs being centered on a common axis and spaced at a distance of 50 cm from each other.

7. The electro-acoustic transducer as claimed in claim 1, wherein said "active" loudspeaker is turned towards a ceiling.

8. The electro-acoustic transducer as claimed in claim 1, wherein the two loudspeakers are fixed on spaced rigid discs, the discs being centered on the same longitudinal axis as said longitudinal axis of said enclosure at a distance of 50 cm from each other and being positioned at the outermost ends of said enclosure, and the two loudspeakers facing in opposite directions with said "active" loudspeaker being turned towards a ceiling.

9. The electro-acoustic transducer as claimed in claim 8, wherein said enclosure has a base with the "passive" loudspeaker mounted therein to face towards ground, and means for supporting said "passive" loudspeaker at a minimum height of 30 cm above the ground and free of any contact with the ground.

10. The electro-acoustic transducer as claimed in claim 1, wherein said enclosure has a base with the "passive" loudspeaker mounted therein to face towards ground, and means for supporting said "passive" loudspeaker at a minimum height of 30 cm above the ground and free of any contact with the ground.

11. The electro-acoustic transducer as claimed in claim 1, wherein each said loudspeaker has a diameter slightly less than a diameter of said enclosure, and said two loudspeakers are spaced 50 cm apart from each other at a distance along said axis.

12. Electro-acoustic transducer according to claim 1, including means for suspending said enclosure above ground, said suspending means being incapable of transmitting vibrations or of resonating with the transducer at a minimum height of about 30 cm from the ground.

13. The electro-acoustic transducer as claimed in claim 12, wherein said "active" loudspeaker is disposed at the top of the vertical enclosure, said "active" loudspeaker being the sole speaker at the top of said enclosure.

14. Electro-acoustic transducer according to claim 12, wherein said suspension means for said enclosure supports means for electrically feeding said active loudspeaker.

15. Electro-acoustic transducer according to claim 1, including rigid disks and means mounting said loudspeakers on said rigid disks formed of an acoustically absorbant material, each said disk having a diameter just greater than the diameter of said loudspeakers, said flexible material being disposed about said loudspeakers.

16. Electro-acoustic transducer according to claim 1, wherein said active loudspeaker is an electrodynamic loudspeaker.

* * * * *